United States Patent
Hlatky et al.

(10) Patent No.: US 9,857,948 B2
(45) Date of Patent: Jan. 2, 2018

(54) METHOD, APPARATUS AND COMPUTER-READABLE STORAGE MEANS FOR ADJUSTING AT LEAST ONE PARAMETER

(71) Applicant: NATIVE INSTRUMENTS GmbH, Berlin (DE)

(72) Inventors: Michael Hlatky, Berlin (DE); Dinos Vallianatos, Berlin (DE); Christian Wachsmuth, Berlin (DE)

(73) Assignee: Native Instruments GMBH, Berlin (DE)

( * ) Notice: Subject to any disclaimer, the term of this patent is extended or adjusted under 35 U.S.C. 154(b) by 0 days.

(21) Appl. No.: 14/339,949

(22) Filed: Jul. 24, 2014

(65) Prior Publication Data

US 2015/0029115 A1   Jan. 29, 2015

(30) Foreign Application Priority Data

Jul. 24, 2013  (EP) ..................................... 13177851
Aug. 15, 2013  (EP) ..................................... 13180601

(51) Int. Cl.
G06F 3/0362  (2013.01)
G06F 3/041  (2006.01)
(Continued)

(52) U.S. Cl.
CPC .......... *G06F 3/0484* (2013.01); *G06F 3/0362* (2013.01); *G06F 3/041* (2013.01);
(Continued)

(58) Field of Classification Search
CPC .... G06F 3/0362; G06F 3/03547; H04H 60/04
See application file for complete search history.

(56) References Cited

U.S. PATENT DOCUMENTS 5,678,539 A * 10/1997 Schubert ........... A61M 16/0051
                                                 128/204.21
5,719,570 A    2/1998 Breitbarth
(Continued)

OTHER PUBLICATIONS

Devine, "Undead instruments—timeFrog II—Inertial sensor gestures", Retrieved on Nov. 7, 2013, from http://vimeo.com/26930534#at=0 (video).
(Continued)

*Primary Examiner* — Patrick F Marinelli
(74) *Attorney, Agent, or Firm* — Fox Rothschild LLP; Robert J. Sacco; Carol E. Thorstad-Forsyth (57) ABSTRACT

The present invention concerns a method, an apparatus and a computer-readable storage means for adjusting at least one parameter, which can be used for enhancing the user experience of adjusting parameters, especially of adjusting parameters in common audio software through a system of assignable rotary encoders with capacitive-sensing knob caps and a parameter type aware software. In particular, the present invention ensures that parameters of (audio) software can be adjusted quickly, without diverting a user's attention from actual tasks.

For this purpose, a method is proposed, where at least one touch sensitive input element is provided, for at least one of the input elements at least one of a time between subsequent sensed contacts and a time of the presence of the contact is determined, based on the determined time it is decided, whether the contact is a tap gesture, and a parameter is adjusted depending from the tap gesture.

15 Claims, 4 Drawing Sheets

(51) Int. Cl.
*G06F 3/044* (2006.01)
*G06F 3/0484* (2013.01)
*G06F 3/0485* (2013.01)
*G06F 3/0488* (2013.01)
*G10H 1/00* (2006.01)
*G10H 1/055* (2006.01)
*G10H 1/46* (2006.01)
*H03K 17/96* (2006.01)
*H04H 60/04* (2008.01)

(52) U.S. Cl.
CPC ............ *G06F 3/044* (2013.01); *G06F 3/0485* (2013.01); *G06F 3/0488* (2013.01); *G06F 3/04847* (2013.01); *G10H 1/0091* (2013.01); *G10H 1/0551* (2013.01); *G10H 1/46* (2013.01); *H04H 60/04* (2013.01); *G10H 2220/096* (2013.01); *G10H 2230/015* (2013.01); *H03K 17/962* (2013.01)

(56) References Cited

U.S. PATENT DOCUMENTS

| | | | | |
|---|---|---|---|---|
| 5,757,941 A * | 5/1998 | McMillen | | H04H 60/04 381/119 |
| 5,880,718 A * | 3/1999 | Frindle | | H03K 17/962 341/33 |
| 5,959,610 A | 9/1999 | Silfvast | | |
| 6,094,491 A * | 7/2000 | Frindle | | H03K 17/962 381/119 |
| 6,131,047 A * | 10/2000 | Hayes, Jr. | | G06F 3/0236 345/173 |
| 6,642,919 B1 * | 11/2003 | Jaeger | | G06F 1/1601 345/1.2 |
| 6,728,382 B1 * | 4/2004 | Silfvast | | H04H 60/04 381/119 |
| 6,813,530 B1 | 11/2004 | Ives et al. | | |
| 7,469,381 B2 | 12/2008 | Ording | | |
| 7,640,454 B1 * | 12/2009 | Botes | | G06F 11/1438 714/19 |
| 7,664,849 B1 * | 2/2010 | Chandler | | G06F 11/0727 709/224 |
| 7,864,503 B2 * | 1/2011 | Chang | | G06F 3/044 200/269 |
| 7,936,889 B2 * | 5/2011 | Aiso | | H04H 60/04 369/4 |
| 8,014,543 B2 * | 9/2011 | Hirano | | H04H 60/04 381/119 |
| 8,253,004 B2 * | 8/2012 | Homburg | | G10H 1/20 84/609 |
| 8,269,718 B2 * | 9/2012 | Iwamura | | G06F 3/0362 345/156 |
| 8,325,945 B2 * | 12/2012 | Fujita | | H04H 60/04 381/104 |
| 8,369,974 B2 * | 2/2013 | Daisy | | G06F 3/0488 700/94 |
| 8,381,103 B2 * | 2/2013 | Terada | | G06F 9/4446 715/705 |
| 9,063,644 B2 * | 6/2015 | Zeng | | G06F 3/04847 |
| 9,076,264 B1 * | 7/2015 | Gillespie | | G06T 11/206 |
| 9,205,914 B1 * | 12/2015 | Fagan | | B64C 19/00 |
| 9,310,901 B2 * | 4/2016 | Wussler | | G06F 3/0362 |
| 9,547,414 B2 | 1/2017 | Klepper et al. | | |
| 2003/0152241 A1 * | 8/2003 | Eastty | | H04H 60/04 381/109 |
| 2005/0090913 A1 | 4/2005 | Terada et al. | | |
| 2005/0177287 A1 * | 8/2005 | Wang | | B60K 37/06 701/36 |
| 2006/0144397 A1 * | 7/2006 | Wallace | | A61M 16/0051 128/204.21 |
| 2006/0187216 A1 * | 8/2006 | Trent | | G06F 3/03547 345/173 |
| 2006/0195801 A1 * | 8/2006 | Iwamura | | G06F 3/0362 715/864 |
| 2006/0256090 A1 * | 11/2006 | Huppi | | A63F 13/02 345/173 |
| 2006/0282562 A1 * | 12/2006 | Aiso | | H04H 60/04 710/33 |
| 2007/0057922 A1 * | 3/2007 | Schultz | | G06F 3/03547 345/173 |
| 2007/0085841 A1 | 4/2007 | Tsuk et al. | | |
| 2007/0209002 A1 * | 9/2007 | Terada | | G06F 9/4446 715/705 |
| 2008/0046098 A1 * | 2/2008 | Corbin | | G10H 1/0091 700/1 |
| 2008/0165141 A1 * | 7/2008 | Christie | | G06F 3/044 345/173 |
| 2008/0180393 A1 * | 7/2008 | Iwamura | | G06F 3/0362 345/156 |
| 2008/0295032 A1 * | 11/2008 | Gioscia | | G06F 3/0338 715/840 |
| 2008/0315798 A1 * | 12/2008 | Diederiks | | H05B 33/0863 315/312 |
| 2009/0009491 A1 | 1/2009 | Grivna | | |
| 2009/0166100 A1 * | 7/2009 | Matsubara | | G06F 3/03545 178/18.06 |
| 2009/0234479 A1 * | 9/2009 | Shimizu | | H04H 60/04 700/94 |
| 2009/0304207 A1 | 12/2009 | Cooper | | |
| 2010/0214257 A1 * | 8/2010 | Wussler | | G06F 3/0362 345/174 |
| 2010/0302168 A1 * | 12/2010 | Giancarlo | | G06F 3/0202 345/169 |
| 2010/0318204 A1 * | 12/2010 | Daisy | | G06F 3/0488 700/94 |
| 2011/0019841 A1 * | 1/2011 | Fujita | | H04H 60/04 381/119 |
| 2011/0029865 A1 * | 2/2011 | Gilland | | G06F 19/3406 715/702 |
| 2011/0041095 A1 * | 2/2011 | Reed | | G06F 3/0481 715/834 |
| 2011/0063230 A1 * | 3/2011 | Mazur | | G10H 1/0091 345/173 |
| 2011/0085682 A1 * | 4/2011 | Park | | G06F 3/0488 381/119 |
| 2011/0100198 A1 * | 5/2011 | Gatzsche | | G10H 1/0008 84/615 |
| 2011/0130200 A1 * | 6/2011 | Terada | | G06F 3/04847 463/31 |
| 2011/0240455 A1 | 10/2011 | Kulczycki et al. | | |
| 2011/0273316 A1 * | 11/2011 | Chabot | | G06F 3/14 340/971 |
| 2012/0026090 A1 | 2/2012 | Zielke et al. | | |
| 2012/0237038 A1 * | 9/2012 | Hagiwara | | H04H 60/04 381/17 |
| 2013/0087037 A1 * | 4/2013 | Dreher | | G10H 1/0066 84/645 |
| 2013/0249814 A1 * | 9/2013 | Zeng | | G06F 3/04847 345/173 |
| 2014/0191979 A1 * | 7/2014 | Tsudik | | G06F 3/04883 345/173 |
| 2014/0214189 A1 * | 7/2014 | Goodwin | | H04H 60/04 700/94 |
| 2014/0221832 A1 * | 8/2014 | El-Zehiry | | A61B 8/54 600/437 |
| 2014/0254834 A1 * | 9/2014 | Umeo | | H04R 5/04 381/119 |
| 2014/0258935 A1 * | 9/2014 | Nishida | | G06F 3/038 715/833 |
| 2014/0266569 A1 | 9/2014 | Yoshikawa et al. | | |
| 2015/0002487 A1 * | 1/2015 | Miles | | G06F 3/0312 345/184 |
| 2015/0026613 A1 * | 1/2015 | Kwon | | G06F 3/04886 715/764 |
| 2015/0029115 A1 * | 1/2015 | Hlatky | | G06F 3/041 345/173 |
| 2015/0029145 A1 * | 1/2015 | Hlatky | | G06F 3/041 345/174 |
| 2015/0062014 A1 * | 3/2015 | Ludwig | | G06F 3/0346 345/163 |

(56) References Cited

U.S. PATENT DOCUMENTS

| | | | |
|---|---|---|---|
| 2015/0078584 A1* | 3/2015 | Moon | G10H 1/46 |
| | | | 381/104 |
| 2015/0261372 A1* | 9/2015 | McMillen | G10H 1/02 |
| | | | 345/174 |
| 2016/0139788 A1* | 5/2016 | Nishikori | G11B 27/34 |
| | | | 715/716 |

OTHER PUBLICATIONS

Native Instruments GmbH, "Traktor kontrol S4 manual", Retrieved on Nov. 6, 2013, from http://www.ferrispark.com/audio/Traktor%20Kontrol%20S4%20Manual%20English.pdf (233 pages).

Ui, "timeFrog@interferenceCulturelle xtr3", Retrieved on Nov. 11, 2013, from http://www.youtube.com/watch?v=DQk6oPvFeMY (video).

Undead Instruments, "TimeFrog vII—User manual v1.3, firmware 1.26", Retrieved on Nov. 7, 2013, from http://www,undeadinst.com/products/timefrog/manuels/manuel-dutilisation-1.3 (16 pages).

\* cited by examiner

METHOD, APPARATUS AND COMPUTER-READABLE STORAGE MEANS FOR ADJUSTING AT LEAST ONE PARAMETER

CROSS REFERENCE TO RELATED APPLICATIONS

This application claims priority to European Application No. 13177851.6, filed Jul. 24, 2013, and titled "Method, Arrangement, Computer Program and Computer-Readable Storage Means for Controlling at least one Parameter or at least one Object Using Capacity Sensing Input Elements," the entirety of which is incorporated by reference. This application also claims priority to European Application No. 13180601.0, filed Aug. 15, 2013, and titled "Method, Arrangement, Computer Program and Computer-Readable Storage Means for Controlling at least one Parameter Using Capacity Sensing Input Elements," the entirety of which is incorporated by reference.

FIELD OF INVENTION

The present invention concerns a method, an apparatus and a computer-readable storage means for adjusting at least one parameter, which can be used for enhancing the user experience of adjusting parameters, especially of adjusting parameters in common audio software through a system of assignable rotary encoders with capacitive-sensing knob caps and a parameter type aware software. In particular, the present invention ensures that parameters of (audio) software can be adjusted quickly, without diverting a user's attention from actual tasks.

BACKGROUND

Controlling Parameters in Audio Software

Most analogue audio equipment is built following the "one knob per job" idiom. This means that each adjustable setting option that influences the sound of the device is controllable using one dedicated hardware control. Hence this hardware control can be designed to enable optimal controllability regarding the "functioning" of the parameter, for instance:

The level of a channel of a mixing console is controlled by a linear fader, as its position is easily readable, and multiple adjacent channel's levels are controllable simultaneously, as the user can adjust multiple faders' positions using one finger per fader.

The cut-off frequency of an analogue synthesizer's filter is controlled by a dominantly sized potentiometer, as it is one of the most frequently adjusted and most influential parameter to the synthesizer's sound.

The octave selector of an analogue synthesizer's oscillator is built as a detented "chicken head" knob with as many discrete positions as the oscillator provides octave settings, as this knob type's setting is clearly readable and it is highly improbable to inadvertently misadjust the knob.

This variety of control elements and the resulting level of controllability is what often gives analogue audio equipment its distinctive feel and satisfies its user's hedonic desires. However, when simulating analogue audio equipment in software, those dedicated hardware controls often turn into mere parameters, only represented by an illustration displayed on the computer screen, resulting in a loss of affective qualities and reduced level of controllability.

In most common audio software there are two ways to manipulate a parameter's value: It can be adjusted either directly, using the computer mouse or a touch screen to manipulate the parameter's on-screen visual representation, or remotely by using controls on an additional hardware controller.

In most cases, such an additional hardware controller is generic and therefore configurable to work with most common audio software by utilizing standardized communication protocols (e.g. MIDI), whereby the user is usually free to assign the hardware's controls to the parameters offered by the software. This means that one control on the hardware may represent different software parameters, depending on the current mapping.

The following generic control types, usually to be found on standard audio software controller hardware are generally provisioned for controlling software parameters:

Rotary potentiometers with a left and right limit, occasionally with an additional zero detent Rotary endless encoders Stepped rotary endless encoders Linear potentiometers The generic hardware controllers are further also mostly agnostic of their currently assigned parameter's functioning. This often results in that users encounter "disconnect" situations, where a hardware control is mapped to a software parameter in such a way that the hardware control does not at all represent the controlled parameter's functioning. Situations like this are for instance:

A parameter with a limited value range is mapped to an endless rotary encoder.

A parameter with a continuous value range is mapped to a stepped encoder.

A parameter with a number of discrete values is mapped to a non-stepped encoder.

In all these cases, the controllability of the parameter through the user is reduced in comparison to the appropriate "parameter functioning-control type" pairing. The parameter value might not be adjustable as precisely or quickly, and the generic control might further not emanate the impact of its associated parameter towards the sound.

In another special case of using common audio software, the controls on current hardware controllers may not only be mapped to adjust an audio signal processor's parameter value, but also for other control tasks such as list selection, for instance to select a parameter preset for a virtual instrument, or the next song to play in a DJ software. Most current controllers provide stepped encoders for this use case, as the user is provided with a distinct tactile feedback for each incremental change in the selection.

However, navigating long lists can become very cumbersome and time-consuming using this method, as the number of steps on most rotary encoders is small compared to the number of list entries commonly found in these use cases. Navigating for instance through a list of only 1000 songs using a 24-step encoder, the user may have to turn the encoder for multiple full revolutions until the desired list entry is found. Some software tries to counteract against this problem by introducing behaviours similar to the mouse acceleration functionality, namely that the selection offset per encoder increment is amplified depending on the turning speed of the encoder. This method, however, leads to a disconnect between the haptic feedback provided by the encoder increments and the selection progress.

On current touch screen computers, the problem of navigating long lists that display only a small subset of their items is mainly solved by modelling the list's motional behaviour by using an inertia simulation. A user can introduce movement to the list by swiping the list's displayed entries into the desired direction. When the to-selected entry becomes visible, the user can stop the list's movement by tapping down a finger onto the list's visual on-screen representation, then appoint the to-selected list entry by tapping into its corresponding screen real estate.

PRIOR ART

Common audio software provides multiple ways to accomplish this, by for instance implementing the operating system's standard "undo" behaviour, or by providing A and B parameter sets which can be accessed via additional short cuts or buttons. Many of these ways, however, have in common that they might take the user's focus away from setting the parameter's value, hence possibly breaking the user's creative flow.

Control knobs with additional capacitive-sensing functionality for general purpose applications are known from the publications US 2009/0009491 A1 (Capacitive Sensing Control Knob) or US 2011/0240455 A1 (Control Knob). Large format mixing consoles and control surfaces for digital audio workstation software are usually equipped with touch-sensing faders (U.S. Pat. No. 5,880,718 A: Capacitive Touch Detection, U.S. Pat. No. 5,719,570 A: Optical encoder based fader design, US 2009/0304207 A1: Sound Mixing Console). In this use case, the touch sensing is used for either channel selection (i.e. the channel whose respective fader was last touched is focussed and usually all its parameters are mapped to be directly accessible by other controls on the mixing desk's surface), or for parameter automation overriding (i.e. a motorized fader stops following a parameter's value once the user touched it). Similarly, mixing consoles have also been equipped with a touch sensing joystick for surround panning applications (U.S. Pat. No. 6,813,530 B1: Audio Console with Motorized Joystick Panning System). A solution for navigating in long lists is known from U.S. Pat. No. 7,469,381 B2 (List Scrolling and Document Translation, Scaling, and Rotation on a Touch-Screen Display).

SUMMARY

It is therefore an object of the invention to provide a method, an apparatus and a computer-readable storage means for adjusting at least one parameter, which obviate the disadvantages of the prior art solutions and, more particularly, enable a user to adjust easily parameters, without diverting the user's attention from actual tasks.

A particular advantage of the present invention consists in that a quick parameter adjustment can be achieved without diverting a user's attention from actual tasks. For this purpose, a method for adjusting at least one parameter is proposed, where at least one touch sensitive input element (also called 'encoder' or 'control') is provided. The at least one input element can be part of a control device. Preferably, a large number of touch sensitive input elements are provided by a control device which controls another device or a process. The invention is especially usable in the context of musical entertainment, where a user of a control device, for example of a mixing console, has to set parameters to a pre-defined value. For example, the volume of a channel shall be set to zero or the filter amplitude parameter shall be set to 0 dB. According to a preferred embodiment, at least a part of the values defines a state of a device.

According to the invention, the time, during which the input element is contacted, or the time between subsequent contacts with the input element, or both are measured. Based on the measured time, it is determined whether a tap gesture has occurred or whether the input element is operated for setting the value, which is assigned to the input element, in conventional way according to the operation of the input element. According to a preferred embodiment, a tap gesture is detected, if the time of the contact is below a pre-defined threshold. Preferably, the threshold is defined between approximately 100 and 500 ms. All contacts with the input element, with a duration below the threshold are defined as tap contacts. One or more tap contacts can define a tap gesture. Thus, there can be a one-tap gesture and multi-tap gestures, such as a two-tap gesture, a three-tap gesture or other multi-tap gestures.

According to a further preferred embodiment, several thresholds are defined.

For example, a first threshold between approximately 100 and 250 ms, and a second threshold between approximately 250 and 500 ms. With the help of several thresholds, tap gestures can be further subdivided or classified. For example, a one-tap gesture can be classified as a short one tap-gesture, if the time of the contact with the input element is below the second threshold, or the one-tap gesture can be classified as a long one tap-gesture, if the time of the contact with the input element exceeds the second threshold, but is below the first threshold. Thus, a large variety of tap gestures can be defined. For determining multi-tap gestures, the time between two subsequent contacts with the input element is evaluated. According to a preferred embodiment, two subsequent contacts are recognized as taps of a multi-tap gesture, if the time between the release of the precedent contact and the release of the (directly) following contact meets a pre-defined condition with respect to a threshold. An exemplarily condition could be evaluating whether the time between the subsequent contacts is below the threshold. Preferably, only subsequent tap gestures are recognized as multi-tap gestures.

According to a preferred embodiment, each tap gesture has assigned a parameter manipulation for adjusting a parameter or a command for adjusting a parameter. For example, a one-tap gesture can have assigned setting the value of the parameter, which is controlled by the contacted input element, to zero; a two-tap gesture may have assigned an undo command, i.e. the parameter, which is controlled by the contacted input element, is set to a previously set value (undo command); or a three-tap gesture may have assigned setting the parameter, which is controlled by the contacted input element, to a pre-defined value, for example a default or reset value. Of course, other assignments or commands are possible. Another exemplarily command, which is executed in response to a tap gesture, is a cyclic switch between values or states. In this case, the new parameter is set depending from the current value.

According to a preferred embodiment, a tap gesture comprises at least two taps. This approach ensures that accidental short contacts with an input element will not trigger an undesired parameter adjustment.

According to another preferred embodiment, the commands for parameter adjustment, which are assigned to an n-tap gesture and an (n+1)-tap (n=1, 2, . . . ) gesture are coordinated with each other. For example, the (n+1)-tap gesture can be a continuation or a refinement of the n-tap gesture. Especially, if the n-tap gesture is causes an undo command, the (n+1)-tap gesture could cause a further undo command, i.e. the parameter is set to the value, which was set before the previous value, or if the n-tap gesture is causes an undo command, the (n+1)-tap gesture could cause setting a default value, such as setting the value to zero.

A previous value (also referred to as atomic adjustment) within the frame of this application is defined as a value, which is set by use of an input element and remains for a pre-defined time period unchanged. According to a preferred embodiment, the time after the input element has been released (thereby setting the value) is measured for determining whether the time period is reached or exceeded. After the time period is reached or exceeded and the input element is not contacted again within this time period, the set value is defined as previous value. Preferably, the previous value is stored on a corresponding storage location. According to a preferred embodiment, for each input element and for each state, which can be set by a parameter (see below), one or several previous values are stored, thereby providing a history of previous values.

According to a preferred embodiment, a previous value is recognized by evaluating capacity values measured by the capacity touch sensitive input element. Preferably, a threshold value is defined for the sensed capacity. If the sensed capacity value is equal to the threshold value or exceeds the threshold value, it is assumed that the touch sensitive input element is contacted by at least two fingers and that conventional operation is performed, i.e. a value of the parameter assigned to the contacted input element is adjusted according to an operation of the input element, for example by rotating a rotatable input element or by shifting a shiftable input element. If a contact with a capacity value which is equal to the threshold or which exceeds the threshold is detected and during the contact the parameter is changed, then the parameter value, which is set after the release, is defined as previous value.

According to a preferred embodiment, a tap gesture causes an adjustment of the parameter, which is assigned to the contacted input element. According to an alternative preferred embodiment, a tap gesture causes an adjustment of a parameter, other than the parameter, which is assigned to the contacted input element. In the latter example, a parameter of at least one another input element, a Boolean parameter or a global parameter may be adjusted. A global parameter can be a parameter, which switches the state of a device to be controlled. For example, the global parameter may cause a change of the instrument played with a synthesizer.

A non-exhaustive list of exemplarily commands, which are executed in response to a tap gesture, is the following:
    setting a parameter to a pre-defined value, for example the value of the volume to zero;
    setting a simulated detented input element to the zero detent, for example a filter amplitude parameter to 0 dB;
    switching cyclically between values;
    performing an undo command, or
    changing the state of a device to be controlled.

An apparatus according to the invention comprises at least one touch sensing input element, preferably a capacity sensing element, and at least one data processing unit and is configured for executing a method for adjusting at least one parameter, where at least one touch sensitive input element is provided, for at least one of the input elements at least one of a time between subsequent sensed contacts and a time of the presence of the contact is determined, based on the determined time it is decided, whether the contact is a tap gesture, and a parameter is adjusted depending from the tap gesture.

According to a preferred embodiment, at least a part of the input elements is realized as touch sensitive, mechanical input elements, such as rotatable, shiftable, pressable input elements. Touch screens or touch pads are not considered as input elements in the sense of the invention.

According to another aspect of the invention a computer program is provided, which after being loaded into the memory of a data processing unit, enables the data processing unit to execute a method for adjusting at least one parameter, where at least one touch sensitive input element is provided, for at least one of the input elements at least one of a time between subsequent sensed contacts and a time of the presence of the contact is determined, based on the determined time it is decided, whether the contact is a tap gesture, and a parameter is adjusted depending from the tap gesture.

Such computer programs can be provided, for example, (fee-based or free of charge, freely accessible or password-protected) for downloading in a data or communication network. The provided computer programs can be used with a method, wherein a computer program is downloaded from an electronic data network, for example from the Internet, to a data processing system connected to the data network.

To perform the method of the invention for managing data, a computer-readable storage medium can be employed, on which a program is stored which, after being loaded into the memory of a data processing unit, enables the data processing unit to perform a method for adjusting at least one parameter, where the method comprises the following steps:
    providing at least one touch sensitive input element;
    determining for at least one of the input elements at least one of a time between subsequent sensed contacts and a time of the presence of the contact;
    determining, based on the determined time, whether the contact is a tap gesture; and
    adjusting a parameter depending from the tap gesture.

Thus, the present invention prevents some of the shortcomings of the prior art solutions and provides an enhanced interaction with software through capacitive sensing knob caps, which is especially useful for an interaction with audio software.

DETAILED DESCRIPTION

Exemplary embodiments of the invention will be described in more detail hereinafter with an example of a system consisting of a hardware controller with continuous endless stepped and non-stepped rotary encoders that are fitted with controller caps with capacitive sensing technology (Capacitive Sensing Control Caps), and a Parameter Type Aware Software.

In this system, the hardware controller provides the software with additional information on whether the encoder is touched by the user, and the software parameter is then set depending on the user's change to the control, the user's touch behaviour, and the parameter type. Depending on the current context, several ways to enhance the controllability of software parameters become possible.

Preferred Embodiment: Tap Gestures on the Control

When operating audio software, oftentimes a user has changed a parameter's value and wants to be able to quickly reset it to its default or last state, for instance to make quick A/B comparisons whether the introduced parameter change resulted in a favourable change in sound.

Employing the Capacitive Sensing Control Caps and Parameter Type Aware Software System, the system can check for a user's finger "taps" on the control's capacitive sensing knob caps by measuring the time delay between the touch and release events, and map different multi-tap gestures to different parameter manipulations. Multi-tap gestures are recognized by comparing the time difference between subsequent touch and release user actions to pre-defined time spans.

In a preferred configuration of the Capacitive Sensing Control Caps and Parameter Type Aware Software System, a double-tap gesture on the knob's cap is triggering the expected "undo" behaviour, namely setting the parameter value back to the state before the last atomic parameter adjustment, whereby an atomic adjustment is defined by setting the parameters value and then letting go the knob for more than a predefined time span. Additionally, a triple-tap gesture is triggering a "reset" behaviour, namely setting the parameter back to its initial value.

These behaviours enable a user to quickly set and reset parameter values without ever having to change the focus away from the current control, thereby enabling maximum concentration on the current task and providing little chance to breaking the user's creative flow.

The different tap gestures can also be mapped to different actions that don't affect the knob's associated parameter, as for instance switching other Boolean parameters.

Figure 1:
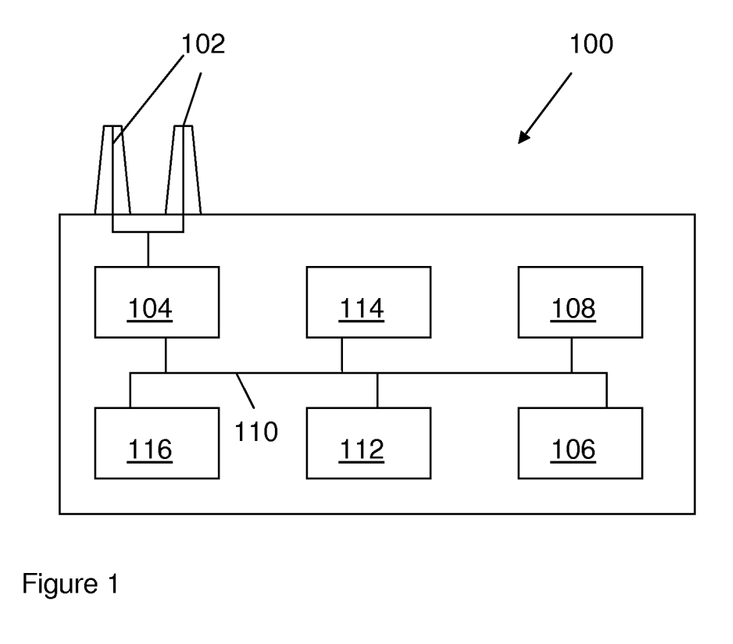
FIG. 1 shows a schematically block diagram of an exemplary apparatus.

FIG. 1 depicts a schematically block diagram of an exemplary apparatus 100. The exemplary apparatus 100 comprises one or more capacity sensing knobs 102. At least a part of the surface of the capacity sensing knobs 102 is realized as a capacity sensing surface. The capacity sensing surface is connected with a sensing system 104 which evaluates the sensed capacity for deciding whether a capacity sensing knob 102 is contacted. The exemplary apparatus 100 comprises further an application 106, for example audio software, which is controlled by control software 108. For this purpose, the control software 108 uses information about contacted capacity sensing knobs 102 provided by the sensing system 104 via a bus system 110. The exemplary apparatus 100 comprises further storage means 112, for example for storing information about contacted capacity sensing knobs 102, time of begin of contact, time of releasing a contact, rules for executing commands in dependence from a tap gesture or such. For determining the time of contact and release, the exemplary apparatus 100 comprises a timer 114. Sensing system 104, application 106, control software 108, storage means 112 and timer 114 are commutatively connected with a central processing unit 116, which executes the method for adjusting parameters.

Figure 2A:
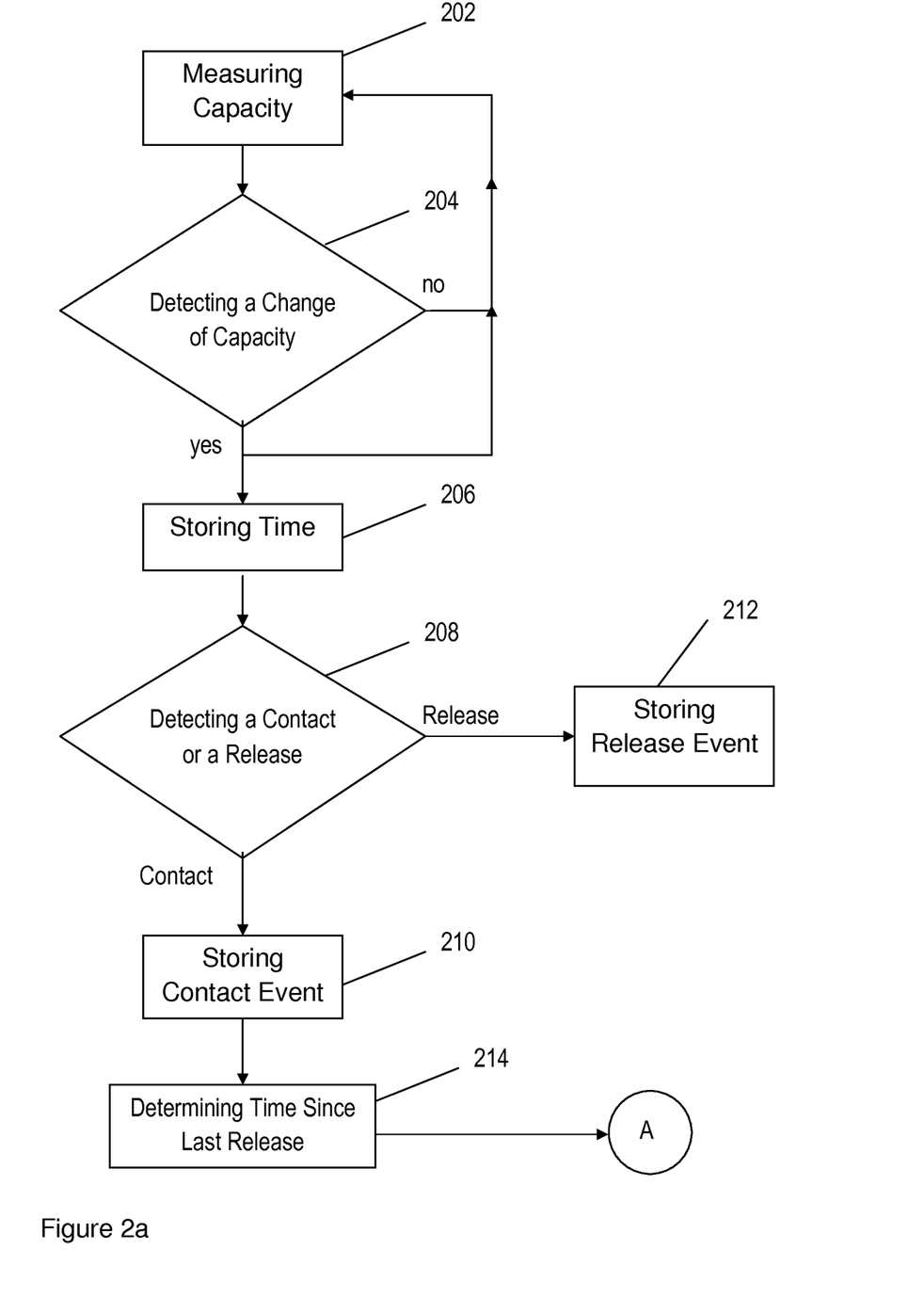
FIGS. 2a-2c show a flow-chart of an exemplarily parameter adjustment.
Figure 2B:
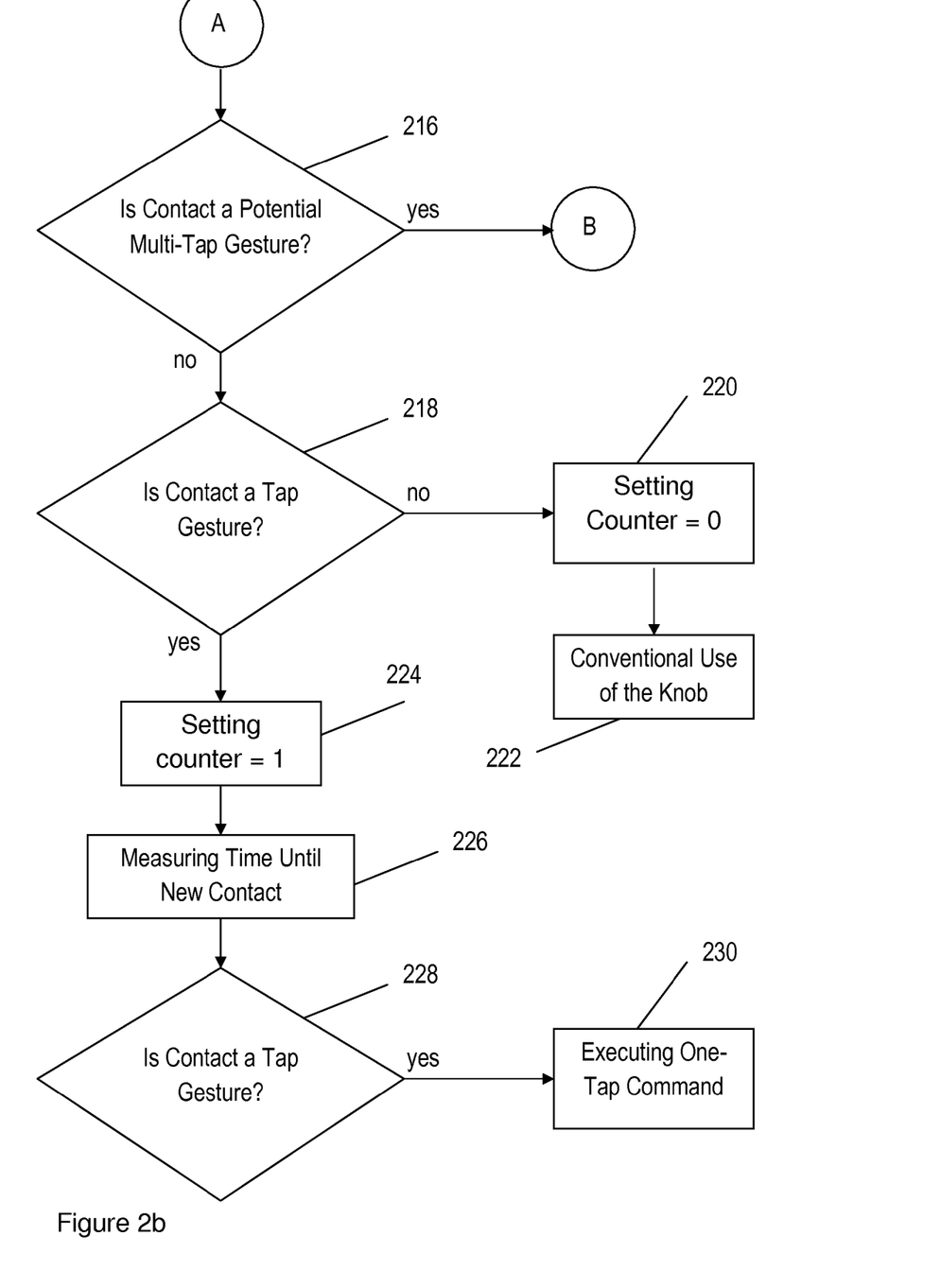
Figure 2C:
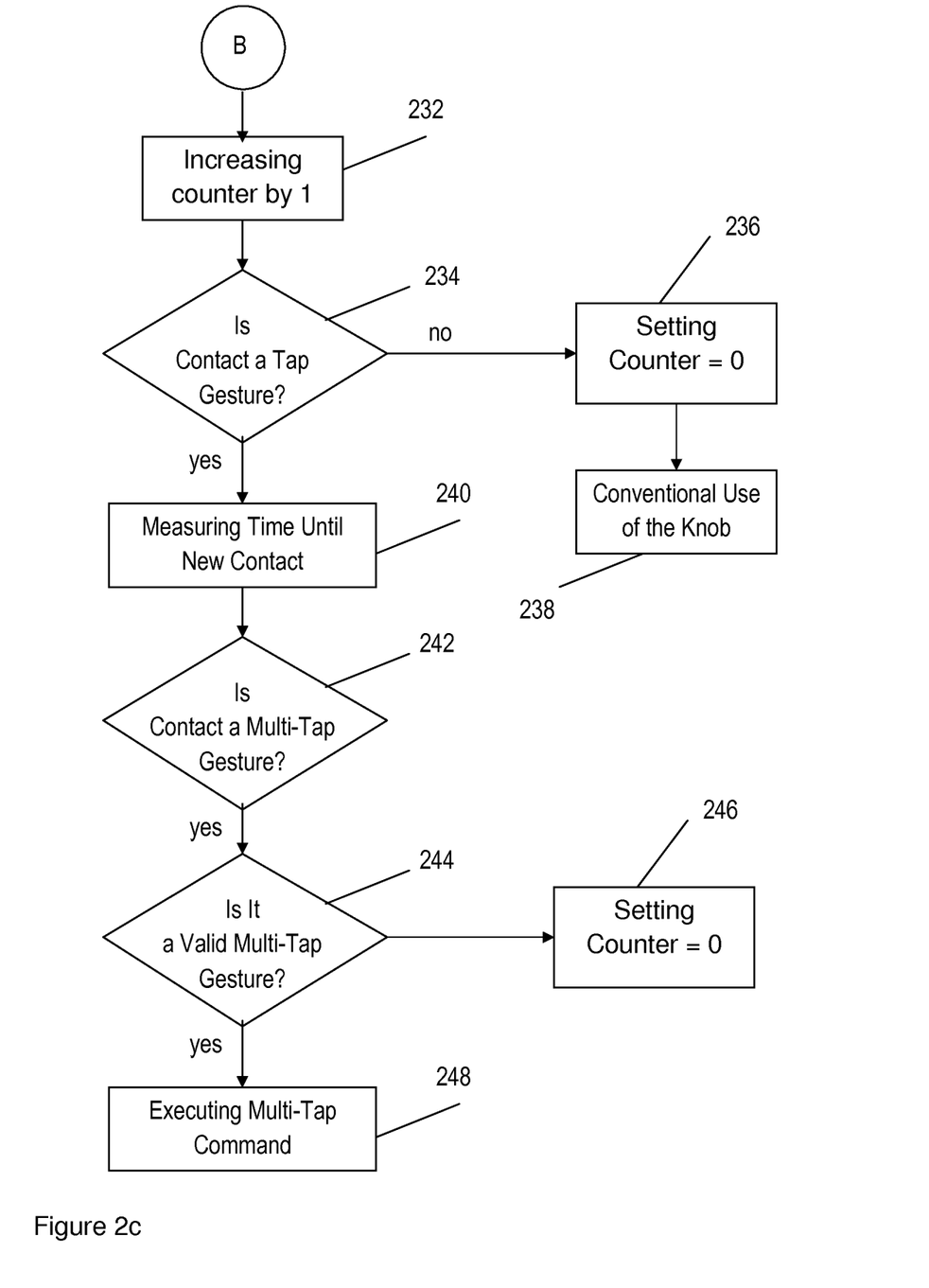

FIG. 2 illustrates with the help of a flow-chart an exemplarily parameter adjustment using one capacity sensing knob 102. The sensor system 104 reads continuously capacity values in a clock pulse of preferably 100 Hz (step 202) and the software of the sensor system 104 detects a change of the capacity. If the capacity sensing knob 102 is contacted by a user, a change of the capacity occurs and is measured by software of the sensor system 104 in step 204. If a change has been detected, the process proceeds to step 206, where the time of the detection of the change is stored in the storage means 112 of the sensor system 104. In the next step 208, it is determined whether the capacity sensing knob 102 is contacted or released. For this purpose, it is evaluated, for example, if a capacity value exceeds or falls below a pre-defined threshold. If a contact is detected, the process proceeds to step 210, where the event 'contact' is stored in the storage means 112 of the sensor system 104. Further, the event 'contact' is assigned to the time, which is stored in step 206.

Otherwise, a release is detected, and the process proceeds to step 212, where the event 'release' is stored in the storage means 112 of the sensor system 104. Further, the event 'release' is assigned to the time, which is stored in step 206.

Let's turn back to the case, where a contact has been detected. After the event has been stored in step 210, the process proceeds to step 214, where, based on the time stored in step 206, the time is determined, which has passed since the last release event. In step 216 it is decided whether the contact is a potential multi-tap gesture. For this purpose, the time, which has passed since the last release event, is compared with a pre-defined threshold. If the time exceeds the threshold, a potential one-tap gesture is recognized, and the process proceeds to step 218, where the time of the contact is determined. If the time of the contact exceeds a further threshold, it is decided that the capacity sensing knob 102 is used in conventional way. A counter, which is used for determination of the number of taps of a multi-tap gesture, is reset to zero in step 220. In the following step 222, the parameter assigned to the capacity sensing knob 102 is adjusted according to the operation of the capacity sensing knob 102.

In the other case, where the time falls below the further threshold, the counter is set to 1 in step 224 (since the contact could be the first tap of a multi-tap gesture). Then, the time, until the next contact is detected, is measured in step 226. In step 228, it is evaluated whether the time measured in step 226 exceeds a time limit. If the time limit is exceeded, it is decided that the contact is a one-tap gesture, and the corresponding command is executed in step 230. For example, the value of the parameter, which is controlled by the contacted capacity sensing knob 102, is set to zero.

Let's turn again to step 216, where it is decided whether the contact is a potential multi-tap gesture. If the time, which has passed since the last release event, falls below the pre-defined threshold, the contact could be a potential multi-tap gesture. In step 232 the counter is increased by 1, and in the subsequent step 234 it is decided whether the contact is a tap gesture. Decision is made based on the time stored in step 206. If the time of the contact exceeds the further threshold, it is decided that the capacity sensing knob 102 is used in conventional way. The counter is reset to zero in step 236. In the following step 238, the parameter assigned to the capacity sensing knob 102 is adjusted according to the operation of the capacity sensing knob 102.

In the other case, where the time of the contact falls below the further threshold, it is decided that the contact is a potential multi-tap gesture. In step 240, the time, until the next contact is detected, is measured. In step 242, it is evaluated whether the time measured in step 240 exceeds a time limit. If the time limit is exceeded, it is decided that the contact is a multi-tap gesture. In step 244 it is evaluated, based on the counter value, which multi-tap gesture it is. The value of the counter specifies the multi-tap gesture. An n-tap gesture is indicated by a value n. If no n-tap gesture is defined (for example since the user has contacted the capacity sensing knob 102 erroneously too often), it is decided in step 244 that an error occurred, and the counter is reset to zero in step 246.

If the value n of the counter is a valid value, an n-tap gesture is detected, and in step 248 the corresponding command is executed. For example, if the counter value is 2, a two-tap gesture is executed, which executes an undo command, i.e. the parameter, which is controlled by the contacted capacity sensing knob 102, is set to a previously set value; or, if the counter value is 3, a three-tap gesture is executed which sets the parameter, which is controlled by the contacted capacity sensing knob 102, to a pre-defined value, for example a default or reset value.

If in steps 228 or 242 a contact within the time limit is detected, the process is continued with step 216.

Of course, the method described above with the help of the flow-chart is only one exemplary embodiment. The objective of the inventive parameter adjustment can be achieved by a number of alternative method steps.

Simulating Inertial Behaviour

With the Capacitive Sensing Control Caps and Parameter Type Aware Software System, a user can navigate long lists quickly by means of a stepped encoder with a capacitive sensing knob cap: As long as the user is holding the knob, the selection is set according to the encoder's increments. A user can, however, spin the encoder quickly and subsequently release the encoder (similarly to the swiping gesture on a touch screen) by which movement is introduced to the list through an inertia simulation. When the to-selected list entry becomes visible, the user can stop the list's movement by touching the knob again, and then appoint the to-selected list entry by incrementally turning the knob accordingly.

Navigating long lists employing this technique becomes an easy task, as the selection precision is not declined: As long as the user touches the knob there is still a clear tactile feedback through the encoder's steps when the selection change is introduced. But by enabling the user to fast-forward the selected list position using an inertia simulation, the selection speed may be greatly enhanced.

The system would also further allow introducing a friction model, which simulates a friction to be overcome by moving the list or object. In this case, the user is provided with a friction feedback, when he starts operating the knob. The friction model can also be applied to the list or objects. In this case, instead of moving (endless) with constant speed, the list or object will move with decrease of the speed, and stop after a while.

The special embodiment described above can be combined advantageously with further functionality provided by the Capacitive Sensing Control Caps and Parameter Type Aware Software System.

Enabling Simultaneous Multiple Parameter Adjustment with Rotary Encoders

Some hardware control types enable simultaneous control over parameters, as for instance in the previously described use case of setting multiple channel levels of a mixing console simultaneously by adjusting several adjacent faders using one finger on each fader. This bandwidth of controllability gets lost when the user is operating on rotary controls, as a rotary encoder requires one-handed (employing the thumb and index finger), not single-finger manipulation. With standard rotary controls, the user is therefore limited to adjusting a maximum of two parameters simultaneously, manipulating one control with the left and one with the right hand.

In a situation where not the controllability precision, but more the controllability speed is of interest to the user, (for instance if the user wants to quickly bring down the level of multiple channels on a software mixing console using rotary encoders) the Capacitive Sensing Control Caps and Parameter Type Aware Software System can support the user to set more than two parameter values simultaneously. This is achieved by having the user select the to-adjusted parameters by touching their corresponding controls with each a single finger of one hand, and manipulating only one rotary control with the other hand. The parameter offset of that one control that is manipulated is then used to also accordingly adjust all other parameters the user selected by touching their corresponding controls.

To precisely set the value for each of the affected parameters, the user might still need to readjust each corresponding control individually in subsequent interaction steps, but in time-critical situations (for instance if an audio feedback is building up in a live music context) the user is provided with a means to quickly react and adjust multiple parameters simultaneously.

Simulating Control Detent Behaviour

There are a number of parameter types in audio software that require a control with one or more distinct tactile detents for precise and quick operation, such as for instance a parametric equalizer's filter amplitude parameter. This parameter type is commonly adjustable continuously over the range between −12 and +12 dB, yet the user needs to be able to quickly disable the filter, i.e. set the amplitude parameter's value to precisely 0 dB. Hence the control with required detent at the zero position for being able to rely on tactile feedback for this task.

If such a parameter is, however, mapped to a continuous endless rotary encoder without detent, the user can only quickly set the parameter to its extreme values by turning the control far enough into the appropriate direction (with the effect that once the parameter has reached its extreme value, any further turning of the control into that direction does not result in a further parameter change, the user has to rely on visual feedback). The user has, however, no way of setting the parameter quickly and precisely to the detent value. If the change is introduced quickly, the user will most probably overshoot or undershoot the value. Yet, if the user tries to set the value precisely, changes need to be introduced gradually while using only visual feedback to check the parameter's value, hence the process will require a considerable time.

To enable a user to quickly set the parameter to the detent value even with a continuous endless rotary encoder, the Capacitive Sensing Control Caps and Parameter Type Aware Software System allows the user to only set the parameter in between the range sections divided by the detent positions, namely −12 to 0 dB, and 0 dB to +12 dB in case of the filter amplitude parameter. The 0 dB "centre detent" therefore acts just like one of the extreme values, i.e. if the user hits the 0 dB value coming from the negative value spectrum, any further change of the control towards the positive value spectrum will result in no further value change.

In order to set the parameter beyond the detent to a value inside the other range section, the user first has to set the parameter to the value representing the detent, release and then touch the knob again, by which the parameter can be set freely in both sections. Once the user has set the parameter to a value in one of the adjacent range sections, the only way to leave that range section again is to set the parameter to the value representing the detent, release and touch the knob again, and then set the parameter to a value in the other range section.

By employing this technique, the user can quickly set the parameter value to the detent, just as quickly as to one of the extremes of the value spectrum. Setting the parameter between values that are on opposite sides of the detent (in the case of the filter amplitude parameter for instance from −3 dB to 3 dB) requires the user to perform two more steps, namely releasing and grabbing the knob again after the parameter reached its detent value.

As the user is, however, interacting with a rotary encoder, these two additional interaction steps might feel natural, even seemingly unnoticeable, as the most common way of adjusting a rotary encoder is to grab the encoder between the thumb and the index finger, twist the encoder cap between the two fingers until a certain rotary motion was achieved, then letting go of the encoder cap quickly and grab the encoder again in the original finger position. So, once the detent value is reached, the user just has to perform the natural interaction sequence of repositioning his fingers on the control and is then free to set the control's associated value beyond the detent.

The same virtual detent technique can be applied to parameter types that require more than one detent, or parameter types providing a number of discrete values, as for instance the previously mentioned octave selector controlling a synthesizer's oscillator with five discrete values (−2, −1, 0, +1, +2). Usually such parameters should be controlled using a stepped rotary encoder, where each step in turning the encoder would result in an incremental change to the parameters value, allowing the user to rely on tactile feedback for timely introducing the discrete value change. If such a parameter is mapped to an endless rotary encoder, the user has little control over when the value change occurs, as the user might not know how "far" the control needs to be turned to trigger the value change.

The capacitive sensing continuous endless rotary controls can, however, also be used to set the discrete values timely. Starting at an initial discrete value, the user can turn the encoder either left or right to reach the next two adjacent values. If the user wants to set the parameter to a value that is not adjacent to the initial value he needs to quickly release and grab the control cap again at each in between value. This interaction sequence only lends itself for parameters with a suitable, not too high count of discrete values, but it is still preferable to having to set the parameter's value with a continuous rotary encoder with no tactile feedback upon when, while turning the knob, the next discrete value change will be introduced.

Each of the previously described control modes can also be combined freely, so for instance a parameter's value could be changed defined by the system through an inertia simulation and the detent simulation, while tap gestures on the knob cap are mapped to the aforementioned reset behaviour. Furthermore, the current knob type and its behaviour could also be visualized using LED rings around the knob.

Embodiments of the invention are not limited to the afore-described preferred exemplary embodiments. Rather, a number of variations are feasible which make use of the method, the arrangement, the computer program or the computer-readable storage means of the invention even with fundamentally different implementations.

The invention claimed is:

1. A method for adjusting at least one parameter, the method comprising:
providing at least one touch sensitive mechanical input element that is part of a control device,
wherein the touch sensitive mechanical input element is configured to be operated in a conventional manner in order to adjust a parameter assigned to the touch sensitive mechanical input element, and
wherein the touch sensitive mechanical input element additionally includes a touch sensitive portion in order to receive a tap gesture;
contacting the touch sensitive portion of the touch sensitive mechanical input element;
determining for the touch sensitive mechanical input element a time of a presence of the contact;
determining, based on the determined time of the presence of the contact in relation to a pre-defined threshold, whether the contact is a tap gesture;
when it is determined that the contact is a tap gesture, adjusting the parameter assigned to the touch sensitive mechanical input element in accordance with a parameter manipulation for adjusting the parameter or a command for adjusting the parameter that is assigned to the tap gesture; and
when it is determined that the contact is not a tap gesture, adjusting the parameter in accordance with the conventional manner in which to operate the touch sensitive mechanical input element.

2. The method of claim 1, wherein at least a part of the tap gestures comprises multiple-tap gestures.

3. The method of claim 1, wherein at least a part of the tap gestures comprises subsequent contacts of different duration with the at least one input element.

4. The method of claim 1, wherein different tap gestures are assigned to different parameter manipulations for adjusting the parameter or to different commands for adjusting the parameter.

5. The method of claim 1, wherein at least one parameter other than the parameter, which is assigned to the contacted touch sensitive mechanical input element, is adjusted.

6. The method of claim 1, wherein the adjusting the parameter in accordance with a parameter manipulation for adjusting the parameter or a command for adjusting the parameter that is assigned to the tap gesture comprises at least one of setting the parameter to a pre-defined value and executing an undo command.

7. The method of claim 6, wherein the pre-defined value is defined by the current value of the parameter.

8. The method of claim 1, wherein the value defines a state of a device.

9. An apparatus, comprising at least one touch sensitive mechanical input element that is part of a control device,
wherein the touch sensitive mechanical input element is configured to be operated in a conventional manner in order to adjust a parameter assigned to the touch sensitive mechanical input element, and
where the touch sensitive mechanical input element additionally includes a touch sensitive portion in order to receive a tap gesture, and
a data processing unit,
the apparatus being configured for executing a method according to claims 1.

10. The apparatus of claim 9, wherein at least a part of the at least one touch sensitive mechanical input element is realized as a capacity sensing input element.

11. The apparatus of claim 9, wherein the apparatus is a mixing console.

12. A non-transitory computer-readable storage medium, on which a program is stored, which enables a data processing system, after the program is loaded into memory means of the data processing system, to execute a method according to claim 1.

13. The method according to claim 1, wherein the touch sensitive mechanical input element is rotatable, and wherein the conventional operation is performed by rotating the touch sensitive mechanical input element.

14. The method according to claim 1, wherein the touch sensitive mechanical input element is shiftable, and wherein the conventional operation is performed by shifting the touch sensitive mechanical input element.

15. The method according to claim 1, further comprising determining for the touch sensitive mechanical input element a time between subsequent sensed contacts; and, if the contact is a tap gesture, determining, based on the time between subsequent sensed contacts, a type of tap gesture.

\* \* \* \* \*